United States Patent [19]
Mattei

[11] Patent Number: 5,133,462
[45] Date of Patent: Jul. 28, 1992

[54] DEVICE FOR FIXING PRINTED CARDS IN A HOUSING AND HOUSING EQUIPPED WITH SUCH A DEVICE

[75] Inventor: Jean-Pierre Mattei, La Varenne, France

[73] Assignee: R. Alkan & Cie, France

[21] Appl. No.: 645,762

[22] Filed: Jan. 25, 1991

[30] Foreign Application Priority Data

Jan. 26, 1990 [FR] France .................. 90 00907

[51] Int. Cl.$^5$ .............................................. A47F 7/00
[52] U.S. Cl. ...................................... 211/41; 361/415; 361/432
[58] Field of Search .............................. 211/41, 26, 50; 361/415, 399, 432

[56] References Cited

U.S. PATENT DOCUMENTS

| | | | |
|---|---|---|---|
| 3,101,185 | 8/1963 | Gustafson | 211/50 X |
| 4,266,677 | 5/1981 | Dewsnap | 211/113 X |
| 4,574,950 | 3/1986 | Koe et al. | 211/41 X |
| 4,574,959 | 3/1986 | Hollett | 211/41 |

Primary Examiner—David M. Purol
Assistant Examiner—Sarah A. Lechok
Attorney, Agent, or Firm—William A. Drucker

[57] ABSTRACT

The fixing device includes parallel slides 1a, 1b, 1c and 1d constituted by double folds of flexible thin curtains disposed opposite one another. Each slide is made up of two lips 2a, 3a, 2b, 3b, 2c and 3c which are able to receive cards 14a, 14b and 14c by sliding. Between the sldies 1a and 1b, the curtain has an arced shape and bears tie rods 6 so that any traction applied to these tie rods 6 flattens the arc-shaped section of the curtain 1, thus pushing back the lip 2a towards the lip 3a and the lip 2b towards the lip 3b. Thus, clamping of the cards 14a and 14b is respectively obtained in the slides 1a and 1b.

The invention is applicable to the fixing of printed cards in housings, particularly on board space and aeronautical vehicles.

9 Claims, 2 Drawing Sheets

DEVICE FOR FIXING PRINTED CARDS IN A HOUSING AND HOUSING EQUIPPED WITH SUCH A DEVICE

FIELD OF THE INVENTION

The invention concerns the electronics industry and more particularly the fixing of printed cards in housings.

BACKGROUND OF THE INVENTION

So as to rearrange the printed circuits, normally parallelpiped housings are embodied with parallel slides equidistant by pairs, each receiving a card introduced through a cover of the housing and pushed as far as its connector so that the latter, placed upstream, is plugged into a connection plate fixed to the bottom of the housings. Secondly, orifices of the housing enable the cards to be cooled by an air current and possibly equipped with a perforated plate or grid for distributing this air.

When vibrations are possible, it is preferable to fix all the cards along the slides. To this effect, curved leaf springs are used, these springs being disposed in such a way as to press each card against its slide.

There also exist under-stress squeezing or clamping holding devices using screws. In, for example, the "LOK-TRAINER" brand known device sold by the BIRTCHER company, an open profile supports an undulated plate stressed by an end screw, thus pushing back the undulations against the card. This device considerably increases weight.

In extreme cases, the card is integrated into a metallic frame fixed by a set of screws into the housing. As the cards are then stacked and not slid, they are no longer independent and the unit then becomes extremely heavy.

SUMMARY OF THE INVENTION

The object of the present invention is to overcome the drawbacks inherent in known devices. It makes it possible to embody housings with printed cards, these housings being much lighter than currently existing housings, but with fixing of the cards without play and enabling the unit to resist vibration stresses, impacts and in particular temperature variations for vehicles and especially for spatial and aeronautical vehicles.

According to the invention, for fixing printed cards, parallel slides are used, each slide including two plain surfaces, known as lips, able to receive the cards by sliding, and clamping devices able to clamp each card along its edge between the two lips opposite each other, the invention being characterized in that the slides are constituted by double folds of thin flexible plates or curtains, each housing receiving two plates opposite each other along two of its lateral walls.

A housing equipped according to the invention comprises a parallelpiped case provided with a cover with a bottom opposite the cover and with lateral sides, said case being characterzed by two flexible thin curtains which comprise sets of double folds, each set forming two parallel lips able to receive one of the edges of a card, each curtain being kept close to one of the sides of the case at a distance from the other curtain corresponding to the width of the cards, and by clamping devices making it possible to individually clamp each card edge between the parallel lips of each curtain double fold.

Clamping is preferably effected on both sides of the edge of the card by bringing together the lips of the double fold forming the slide allowed by virture of the flexibility of the thin curtain, the latter being bent to the right of the double fold.

According to one embodiment of the device of the invention, the double fold leaves a slight play between the two slide lips on both sides of the card, and the curtain has an arc-shaped form between two slides so that a device for flattening this arc-shaped form pushes back the slide lips in contact with it, which brings the lips closer together opposite each other, thus creating a simultaneous clamping of the two cards previously introduced into the two slides.

According to another embodiment, the double fold is embodied narrower so as to obtain at rest a clamping of the double fold on the edges of the card, the latter being introduced (or removed) after the action of a device which emphasizes an arc-shaped form of the curtain between two slides, which distances the two lips opposite each other from each other.

BRIEF DESCRIPTION OF THE DRAWINGS

To more readily understand the invention, there now follows a description of examples of two preferred embodiments with reference to the accompanying diagrammatic drawing in which.

DETAILED DESCRIPTION OF THE PREFFERED EMBODIMENTS

Figure 1:
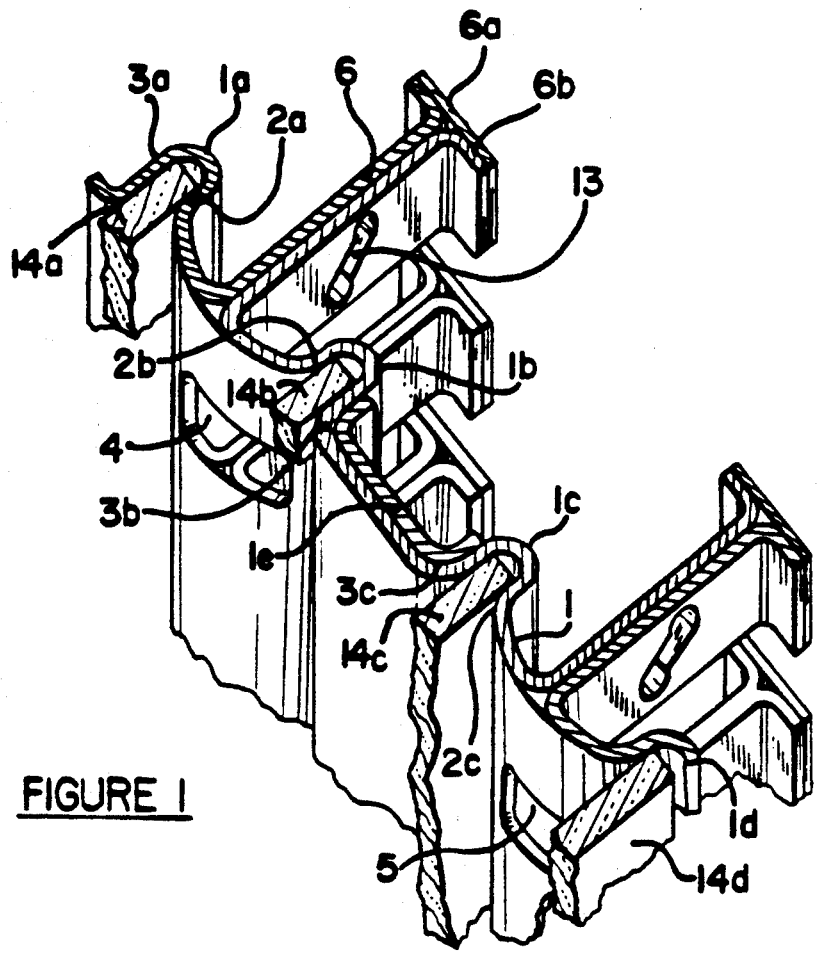
FIG. 1 is a perspective view of a first embodiment of a device for fixing printed cards according to the inventon.

FIG. 1 shows in 1 a curtain made of a draped composite material from a carbon fabric impregnated with thermohardenable resin. The curtain 1 constitutes a "developpable" type surface formed of parallel rectilinear generators. FIG. 1 shows four successive slides 1a, 1b, 1c and 1d forming double folds with parallel lips, respectively 2a and 3a, 2b and 3b, and 2c and 3c. The curtain 1 is pierced between these double folds with orifices, such as those shown at 4 and 5, so as to allow the cooling air to pass.

Between two slides, for example 1a and 1b or 1c and 1d, the curtain has an arc-shaped form whose top in its non-pierced sections comprises tie rods 6 ended by tenons 6a and 6b, all the above being directly draped with the curtain 1. As a result of this arc shape, an accompanying movement of all the tie rods 6 disposed between two slides, such as 1a and 1b or 1c and 1d, has the effect of flattening the arc-shaped form and thus pushing back the lip 2a against the lip 3a and the lip 2b against the lip 3b (or the lip 2c against 3c), which has the result of clamping and keeping the printed cards 14b, 14c or 14d engaged in the slides 1b, 1c and 1d.

The lips 3b and 3c are able to resist this thrust as they are supported by the plain portions of the curtain 1 and possibly reinforced by excess thicknesses, such as 1e.

Figure 2:
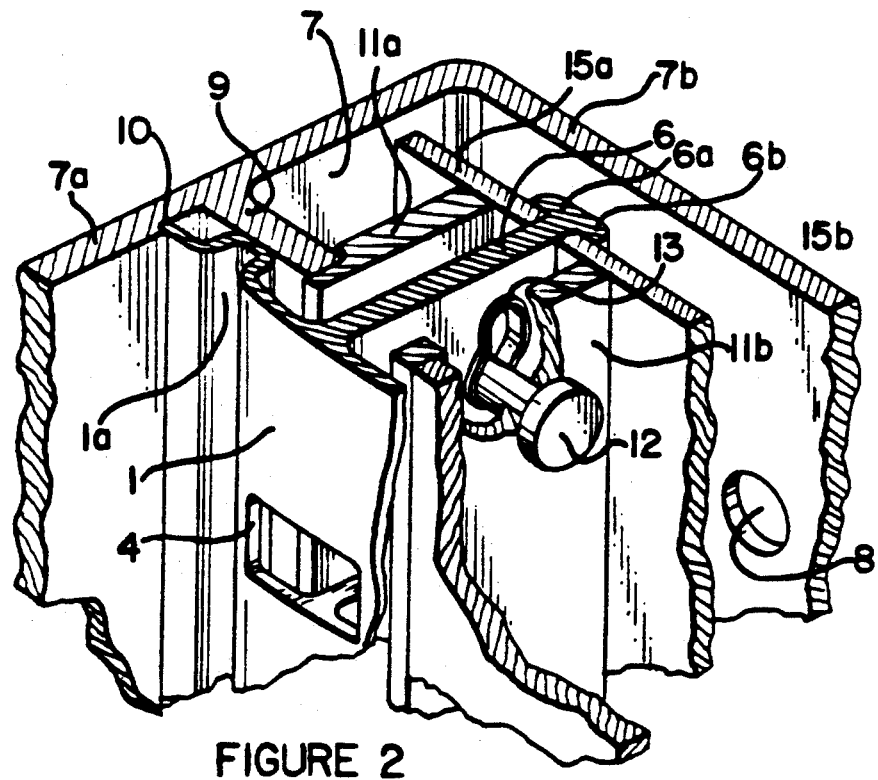
FIG. 2 is a split perspective view of one portion of a housing equipped with the fixing device of FIG. 1.

With reference now to FIG. 2, this figure shows at the top part an angle portion of a housing 7 limited between two lateral walls 7a and 7b of the latter, the cover of the housing having been removed. The wall 7b is the wall through which the cooling air arrives which passes through orifices, such as 8. The wall 7a supports the curtain 1 which is pressed against a partition 9 integral with the wall 7a and paralled to the wall 7b, as well as along an inside recess 10 of the wall 7a. The partition 9 is cut at the right of the tie rods 6.

On both sides of each tie rod alignment between two slides, such as aligning the tie rods 6 between the slides 1a and 1b, a sliding block 11 made up of two stanchions 11a and 11b interconnected by spindles 12 form a sort of ladder. The spindles 12 each traverse a tie rod 6 through an oblong hole 13 slanted from this tie rod so that by driving in the slide block, 11, which rest along the partition 9 with the spindles 12 cooperating with the holes 13, move the tie rods 6 in the direction of the wall 7b, Which flattens the arc shaped form of the curtain 1 and provokes an effective clamping of the card 14b in the slide 1b, as indicated with reference to FIG. 1.

Locking safety is subsequently ensured by introducing locking plates 15a and 15b between the tenons 6a and the slide block 11.

Figure 3:
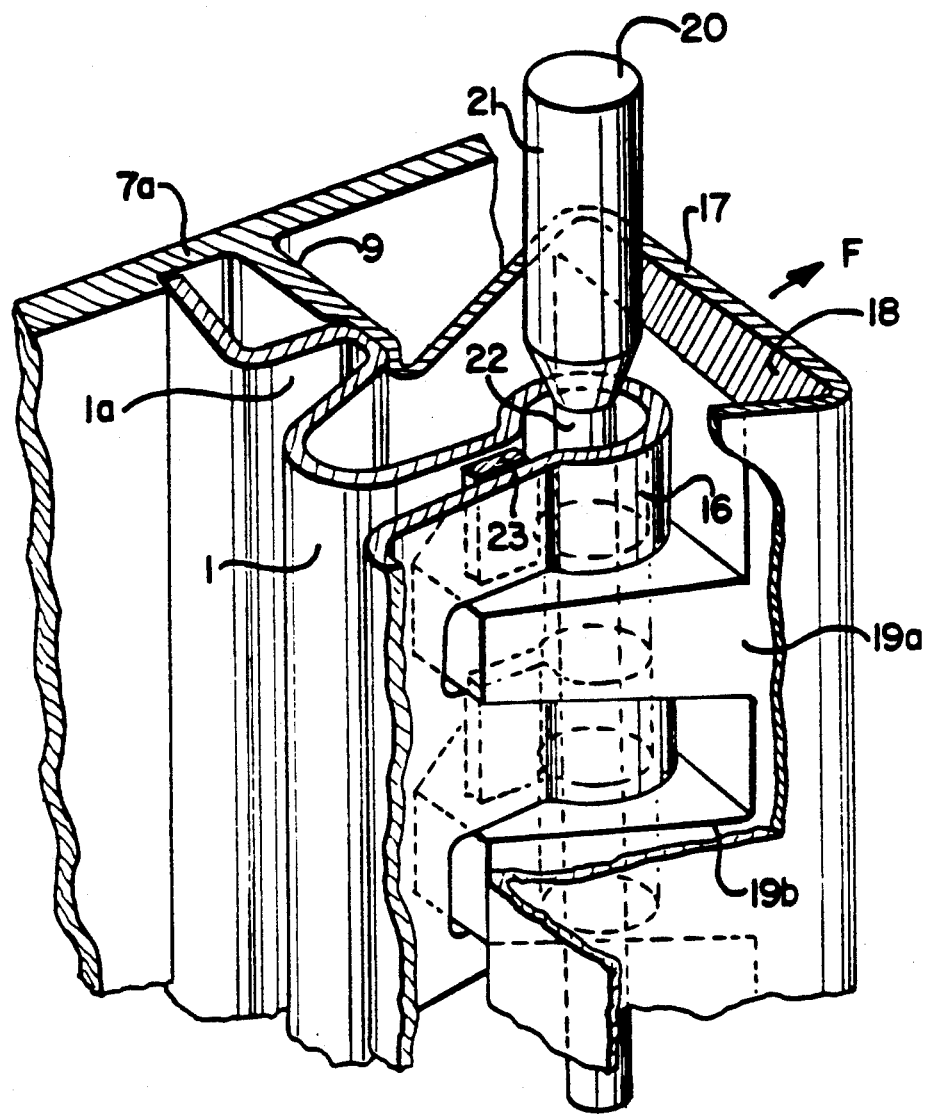
FIG. 3 shows a perspective view of details of a second embodiment of the fixing device of the invention and intended to be mounted inside a housing similar to that of FIG. 2.

With reference to FIG. 3, which shows another embodiment, the partition 9 of the housing 7 has an undulated shape so as to receive the accompanying undulations 16 of the curtain 1 between the slides of the latter, such as 1a. The bottom of each undulation 17 of the partition 9 is reinforced by an excess thickness 18 which carries from one place to another projecting protectors 19a, 19b over its length, these protectors being housed in the openings of the undalations 16 of the curtain 1. A control rod 20 comprising cylindrical swellings, such as 21, progresively connected to those portions of less diameter 22, slides into the guiding holes of the protectors allowing for passage of the swellings, such as 21. When the rod 20 is driven in, its swelled portions, such as 21, take support firstly against the guiding holes and secondly against the bottom of the undulations 16 of the curtain 1, this causing these undulations to move in the direction of the arrow F. This movement of the undulations 16 of the curtain 1 distances the lips 2 and 3 of the slide 1a, as well as those of the slide (not shown on the drawing) symmetrical to it with respect to the undulations 16 and 17.

It can be readily understood that, in normal operation, the tie rod 20 is in its position as shown of FIG. 3 (swellings 21 released from the undulations 16) and the printed cards are supported by having their edges clamped into the slides. So as to remove these cards or place other cards, this clamping is cancelled by moving the control rod 20 so that its swellings 21 are engaged in the undulations 16, as explained in the previous paragraph.

Guides 23 may be advantageously installed in the undulations 16 of the curtain 1 so as to improve the vibration behavior of said-curtain.

The description given above has merely been provided by way of example without any restrictive character and it is possible to carry out constructive additions or modifications without departing from the context of the invention. The preceding description has described the curtain 1 as being made of a composite material including carbon fibers, but it is possible to use a composite material including glass, boron or textile fibers.

What is claimed is:

1. Device for fixing printed cards in a housing, comprising:
    (a) two thin flexible curtains disposed opposite each other along two lateral walls of the housing, each curtain comprising a plurality of folds, each fold defining two plane surfaces shaped as lips which constitute a slide for receiving by sliding an edge of a printed card, and
    (b) actuatable squeezing devices co-acting with said curtains and responsive to actuation thereof to modify the clamping of two said lips on the edge of said printed card.

2. Fixing device according to claim 1 wherein a part of said curtain between two sucessive folds has an arc-shaped form, clamping action being effected on both sides of the edge of the printed card by bringing together the lips of the fold forming the slide allowed by the flexibility of the thin curtain, with a bending of said thin curtain perpendicularly to said fold.

3. Fixing device according to claim 2 wherein, in an inactive position where the squeezing device is not actuated, a slight play is provided on both sides of the printed card between the two lips of said fold, said squeezing device consisting of a flattening device which co-acts with said arc-shaped part of the curtain so as to push back the lips of adjacent folds and bring them closer to said lips opposite each other in order to create a simultaneous clamping of two printed cards previously introduced into the two folds.

4. Fixing device according to claim 3 wherein said flattening device includes tie rods integral at one extremity with the arc-shaped part of the curtain disposed between two folds and one slide block bearing spindles which traverse the tie rods through slanted along holes of said tie rods.

5. Fixing device according to claim 4 wherein said the rods bear tenons which are locked in a position for fixing the cards with the aid of locking plates inserted between said tenons and a stop piece.

6. Fixing device according to claim 2 wherein spacing from each other of the two lips opposite each other of the fold is sufficiently narrow to ensure a clamping of said lips on the edges of the printed card when said squeezing device is not actuated, means actuated by the squeezing device to accentuate the arc-shaped form of a curtain portion between two folds by spacing the two lips opposite each other from each other to allow the printed card to be introduced or removed.

7. Fixing device according to claim 6 wherein said means for accentuating the arc-shaped form of the curtain portion include undulations of the curtain, undulations of a support partition accompanying said curtain undulations and movable means co-acting with said accompanying undulations to ensure a bringing together between the bottoms of said accompanying undulations.

8. Fixing device according to claim 1 wherein said thin curtain is of composite material comprising carbon, glass, boron or textile fibers.

9. Housing equipped with a fixing device according to claim 1 and comprising a parallelepiped case provided with a cover, a bottom opposite said cover, lateral sides, two thin flexible curtains which comprise sets of folds, each of which form two parallel lips to receive one of the edges of a printed card between them, each curtain being kept close to one of the sides of the case at a distance from the other curtain corresponding to the width of the printed cards, and squeezing devices to individually clamp each printed card edge between the parallel lips of each curtain fold.

* * * * *